(12) United States Patent
Vergauwen

(10) Patent No.: US 10,473,493 B2
(45) Date of Patent: Nov. 12, 2019

(54) OSCILLATOR BASED SENSOR INTERFACE CIRCUIT

(71) Applicant: Melexis Technologies NV, Tessenderlo (BE)

(72) Inventor: Johan Vergauwen, Kruibeke (BE)

(73) Assignee: Melexis Technologies NV, Tessenderlo (BE)

( * ) Notice: Subject to any disclaimer, the term of this patent is extended or adjusted under 35 U.S.C. 154(b) by 17 days.

(21) Appl. No.: 15/967,809

(22) Filed: May 1, 2018

(65) Prior Publication Data
US 2018/0321065 A1 Nov. 8, 2018

(30) Foreign Application Priority Data
May 8, 2017 (EP) ..................................... 17169897

(51) Int. Cl.
| | |
|---|---|
| *G01D 18/00* | (2006.01) |
| *H03L 7/093* | (2006.01) |
| *H03L 7/099* | (2006.01) |
| *H03M 1/06* | (2006.01) |
| *H03M 1/10* | (2006.01) |
| *H03M 1/60* | (2006.01) |
| *H03L 7/08* | (2006.01) |

(52) U.S. Cl.
CPC ............. *G01D 18/00* (2013.01); *H03L 7/093* (2013.01); *H03L 7/099* (2013.01); *H03M 1/0604* (2013.01); *H03M 1/1014* (2013.01); *H03M 1/60* (2013.01); *H03L 7/0802* (2013.01)

(58) Field of Classification Search
CPC ...... G01D 18/00; H03M 1/0604; H03M 1/60; H03M 1/1014; H03L 7/099; H03L 7/093; H03L 7/0802
USPC .......................................... 324/236; 341/155
See application file for complete search history.

(56) References Cited

U.S. PATENT DOCUMENTS 8,421,663 B1 * 4/2013 Bennett ............... H03M 1/0678
341/155

OTHER PUBLICATIONS

Danneels et al., "A Novel PLL-based Sensor Interface for Resistive Pressure Sensors," Procedia Engineering, Proc. Eurosensors XXIV, vol. 5, Sep. 5, 2010, pp. 62-65.
(Continued)

*Primary Examiner* — Farhana A Hoque
(74) *Attorney, Agent, or Firm* — Workman Nydegger

(57) ABSTRACT

An oscillator-based sensor interface circuit comprises at least two oscillators, at least one of which is arranged for receiving an electrical signal representative of an electrical quantity being a converted physical quantity, phase detection means arranged to compare output signals of the at least two oscillators and for outputting a digital phase detection output signal in accordance with the outcome of the comparing, a feedback element arranged for converting a representation of the digital phase detection output signal into a feedback signal used directly or indirectly to maintain a given relation between oscillator frequencies of the at least two oscillators, detection means for detecting a difference between the at least two oscillators; and at least one tuning element arranged for receiving the detected difference and for tuning at least one characteristic of the oscillator-based sensor interface circuit.

13 Claims, 7 Drawing Sheets

(56) References Cited

OTHER PUBLICATIONS

Gielen et al., "Time-Based Sensor Interface Circuits in CMOS and Carbon Nanotube Technologies," IEEE Transactions on Circuits and Systems—I: Regular Papers, vol. 63, No. 5, May 2016, pp. 577-586.

Marin et al., "Digital-domain Chopping Techniques for PLL-Based Sensor Interfaces," Procedia Engineering, Eurosensors 2015, vol. 120, 2015, pp. 507-510.

Rice et al., "A Simple Envelope Detector," IEEE Transactions on Instrumentation and Measurement, vol. 37, No. 2, Jun. 1988, pp. 223-226.

Extended European Search Report from EP Application No. EP 17169897.0, dated Nov. 2, 2017.

\* cited by examiner

OSCILLATOR BASED SENSOR INTERFACE CIRCUIT

FIELD OF THE INVENTION

The present invention is generally related to the field of sensor interfaces for sensor systems.

BACKGROUND OF THE INVENTION

Sensors are increasingly important in any field where finer and ever more intelligent control is needed. Examples are found in the growing fields of automotive applications or Wireless Sensor Networks (WSN). In the automotive industry sensors are essential for applications ranging from increased safety to road stability as well as to improve car performance and reliability demanded by customers. Further, compact and low-power sensor interfaces are needed to be competitive on the growing market and to enable new applications for 'the Internet of things'.

Although the market asks for additional functionality, the price pressure remains. The silicon area is a main contributor to the cost of the sensor interface, therefore the interface has to be made as small as possible. This should not only be valid for the technology nodes that are used today (and which are still relative big for the automotive industry), but also in more advanced technologies.

To realize small-area and low-power constraints, new sensor interface architectures are being investigated. Whereas traditional structures contain large and power-hungry analog building blocks, recently the focus has shifted to frequency conversion instead of voltage conversion. Both approaches are briefly introduced now.

The sensor signal is continuous in time and amplitude. Conventionally this analog signal is amplified, sampled and converted to the digital domain by an analog to digital converter (ADC). A well-known ADC type is a Delta-Sigma ADC, which exploits an oversampling of the input signal and a noise shaping technique to obtain an improved precision. In most applications, the sensor signal frequency varies from DC up to 10-100 kHz, which allows the oversampling needed for a Delta-Sigma converter.

Time/frequency-based conversion mechanisms quantize the continuous input signal by using a known time/frequency signal as a reference instead of a voltage. Typically, a time/frequency-based conversion circuit contains two building blocks: a Voltage-to-Time Converter (VTC) transforms the analog signal c(t) into time or frequency information f(t), while a Time-to-Digital Converter (TDC) digitizes this information with the help of a reference frequency. In order to achieve a desired resolution, an accurate reference clock signal is needed. This time/frequency conversion technique is gaining popularity due to its compatibility with newer CMOS technologies. The resolution now depends on the clock frequency instead of the accuracy of analog voltage values. The reduced gate capacitances result in smaller gate delays, improving the timing resolution in these scaled technologies. Furthermore, when the information is stored as frequency information, it is less prone to noise as opposed to when it is stored as voltage information. Sensor signals are in most applications characterized by their low frequency and therefore ideal to use this way of digitization.

Closed-loop oscillator-based sensor interfaces like in FIG. 1 combine the advantages of time based converters (small and scaling with technology) and sigma-delta ADCs (high accuracy due to oversampling and noise shaping). This architecture is basically a Phase-Locked Loop (PLL) structure, but it has also similarities with a sigma-delta converter as explained in the paper "*A novel PLL-based sensor interface for resistive pressure sensors*" (H. Danneels et al., Procedia Engineering, Eurosensors 2010, vol. 5, 2010, pp. 62-65). It has the same noise-shaping properties which contribute in increasing the accuracy (expressed e.g. in terms of SNR).

A typical set-up of a closed-loop oscillator-based sensor read-out circuit contains two controlled oscillators (21, 22), for example two voltage controlled oscillators (VCOs) which are matched, a phase detector (3) to compare the two oscillator outputs (41, 42) and a feedback mechanism (4) towards the sensing means (1). The digital output signal (31) of the interface circuit is also derived from the phase detector output.

A conventional oscillator based sensor interface circuit used in a closed loop as illustrated in FIG. 1 operates as follows. A physical quantity (100) is converted by the sensor (1) into electrical signals (11, 12), that influence the oscillators (21, 22) connected to it. The phase of the oscillator outputs (41, 42) is compared in the phase detector (3). The phase detector output signal (31) is fed back through a feedback element (4) to the sensor (1) in order to keep the phase difference between both oscillators small. The closed-loop ensures that the averaged phase detector output (31) is a digital representation of the physical quantity (100). The input signal containing the physical quantity (100) to be converted in the sensor typically represents a pressure, temperature or magnetic field. Also other types of physical signals can be used as input to the interface.

In any application scheme there is always some mismatch between two or more functional blocks of the sensor system, even if they have exactly the same schematic and layout. This also holds for Voltage Controlled Oscillators (or other controlled oscillators, like Current Controlled Oscillators or Sensor Controlled Oscillators). Probably it is even worse for oscillators than e.g. for amplifiers because they continuously toggle and they can so more easily interfere with each other. This means that the oscillators need to be isolated from each other, which can degrade the matching between them. The mismatch also varies over time and over temperature.

If controlled oscillators are used as sensor interface, the mismatch between the oscillators may result in errors, which may affect the signal conversion. Examples are offset, gain and non-linearity. In the paper "*Digital-Domain Chopping Technique for PLL-based Sensor Interfaces*" (J. Marin et al., Procedia Engineering, Eurosensors 2015, vol. 120, 2015, pp. 507-510) a chopping technique is applied to compensate for the offset error. Additionally calibration can be used to compensate for a big part the initial errors, but it does not compensate the drift over life.

The impact of the oscillator errors on the sensor read-out is also influenced by the common mode of the input of the controlled oscillators. This also causes drift of the sensor interface output. It can be compensated by keeping the common mode signal fixed, but this typically requires an accurate common mode feedback.

These errors and even more a combination thereof limit the accuracy of time-based sensor interfaces.

Consequently, there is a need for an oscillator-based sensor interface wherein at least one or more of these limitations are avoided or overcome.

SUMMARY OF THE INVENTION

It is an object of embodiments of the present invention to provide for an oscillator-based sensor interface circuit for a sensor system with an improved accuracy compared to the prior art solutions.

The above objective is accomplished by the solution according to the present invention.

In a first aspect the invention relates to an oscillator-based sensor interface circuit arranged for offline error tuning. The sensor interface circuit comprises at least two oscillators, at least one of which is arranged for receiving an electrical signal representative of an electrical quantity, said electrical quantity being a converted physical quantity and impacting said at least one oscillator's frequency, phase detection means arranged to compare output signals of said at least two oscillators and for outputting a digital phase detection output signal in accordance with the outcome of said comparing, said phase detector output signal also being an output signal of said oscillator-based sensor interface circuit, a feedback element arranged for receiving a representation of said digital phase detection output signal and for converting said representation into a feedback signal used directly or indirectly to maintain a given relation between oscillator frequencies of said at least two oscillators, detection means for detecting a difference between said at least two oscillators, at least one tuning element arranged for receiving the detected difference and for tuning at least one characteristic of the oscillator-based sensor interface circuit causing a change in oscillator frequency of at least one of said oscillators to reduce said detected difference.

In a second aspect the invention relates to an oscillator-based sensor interface circuit arranged for online error tuning. The sensor interface circuit comprises at least two oscillators, at least one of which is arranged for receiving an electrical signal representative of an electrical quantity, said electrical quantity being a converted physical quantity and impacting said at least one oscillator's frequency, chopping circuitry arranged for modulating said electrical signal representative of said electrical quantity with a chopping signal and for feeding said modulated electrical signal to said at least one oscillator, phase detection means arranged to compare output signals of said at least two oscillators and for outputting a digital phase detection output signal in accordance with the outcome of said comparing, said phase detector output signal also being an output signal of said oscillator-based sensor interface circuit, whereby said chopping circuitry is further arranged for demodulating said output signals before applying said output signals to said phase detection means or for demodulating said digital phase detection output signal, said oscillator-based sensor interface circuit further comprising a feedback element arranged for receiving a representation of said digital phase detection output signal and for converting said representation into a feedback signal used directly or indirectly to maintain a given relation between oscillator frequencies of said at least two oscillators, detection means for detecting a difference between said at least two oscillators based on said digital phase detection output signal, at least one tuning element arranged for receiving said detected difference and for tuning at least one characteristic of the oscillator-based sensor interface circuit causing a change in oscillator frequency of at least one of said oscillators to reduce said detected difference.

The proposed solution indeed allows for detecting an error of the interface circuit and subsequently reducing that error by means of the tuning element. The invention focusses in the first place on oscillator mismatches, but also allows compensating errors due to other functional blocks of the circuit or of the system the circuit is part of. The tuning can be performed online or offline.

In a preferred embodiment the sensor interface circuit comprises chopping circuitry arranged for modulating said electrical signal representative of said electrical quantity with a chopping signal and for outputting said modulated signal to the at least one oscillator and also arranged for demodulating.

In a preferred embodiment the chopping circuitry is arranged for demodulating the output signals of the at least two oscillators and applying the demodulated output signals to the phase detection means.

In another preferred embodiment the chopping circuitry is arranged for performing demodulation on the digital phase detection output signal. This can optionally be done after filtering the digital phase detection output signal.

In one embodiment the oscillator-based sensor interface circuit further comprises a digital filter arranged for filtering the digital phase detection output signal and for applying the filtered digital phase detection output signal to the feedback element.

In a preferred embodiment the oscillator-based sensor interface circuit comprises a sensing means arranged for converting the physical quantity comprised in a received signal into the electrical quantity and for outputting the electrical signal representative of the electrical quantity.

In one embodiment the sensing means comprise a sensor arranged for receiving the signal comprising the physical quantity and a reference element arranged to generate a reference signal.

In one embodiment the feedback element comprises at least one current source.

In a preferred embodiment the oscillator-based sensor interface circuit comprises a Wheatstone bridge where said feedback element is part of.

In another embodiment the phase detection means comprises a flip-flop.

In one embodiment the error detection means is arranged for detecting said error by making a difference of the averaged digital output signals obtained after chopping.

In one embodiment the feedback signal goes back to said sensing means.

In yet another embodiment the feedback signal is a differential signal.

In an embodiment the at least one tuning element arranged for gain tuning at least one of said at least two oscillators. In another embodiment the at least one tuning element arranged for offset tuning at least one of said at least two oscillators.

In one embodiment the received signal is one of a pressure, a temperature, a force, a signal from an optical sensing means or from a magnetic sensing means.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

DETAILED DESCRIPTION OF ILLUSTRATIVE EMBODIMENTS

Figure 1:
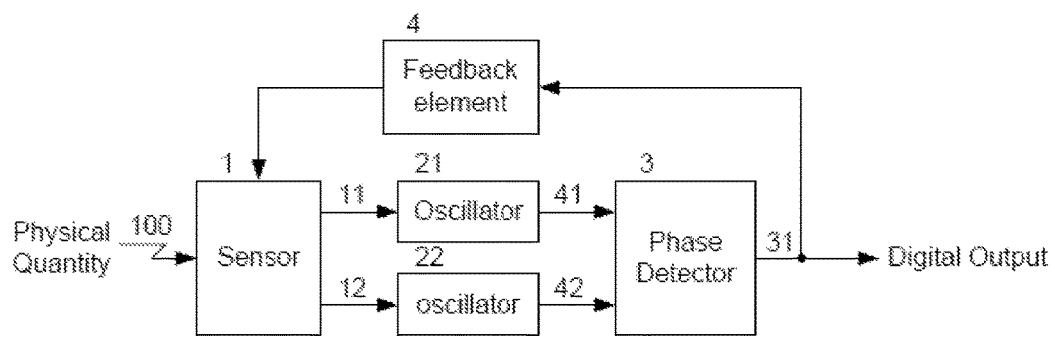
FIG. 1 illustrates a conventional oscillator based sensor interface circuit used in a closed loop.

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

A sensor converts a physical quantity into an analog electrical quantity. Typically the sensor output signal is too small to be used directly. Therefore a sensor interface circuit amplifies the signal comprising the electrical quantity received from the sensor to obtain a more useful signal. The signal is often also further processed (e.g. filtered) in the sensor interface. Additionally the signal can be converted to a digital signal and further processed in the digital domain. In the context of the present invention a sensor interface circuit is considered to be a structure to transfer the electrical quantity coming out of the sensor into a digital signal. Although the input signal containing the physical quantity (100) to be converted in the sensor often represents a pressure, temperature or magnetic field, also other types of physical signals can be used as input to the interface circuit of this invention.

Although it may be advantageous in many embodiments of the sensor interface circuit of the invention to have the sensor as a part of the interface circuit, this is not strictly required. In other embodiments the sensor(s) may be external to the circuit of the invention and the circuit is fed with an electrical signal representative of the electrical quantity into which the physical quantity is converted in the sensor.

Figure 2A:
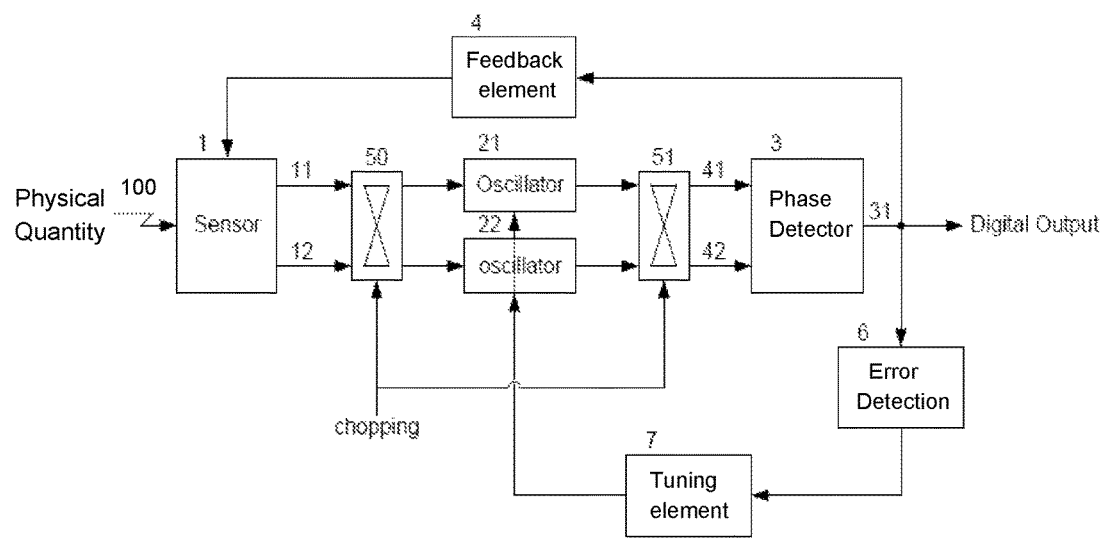
FIG. 2a shows a basic scheme of an embodiment of an oscillator based sensor interface according to the invention, wherein chopping is applied.
Figure 2B:
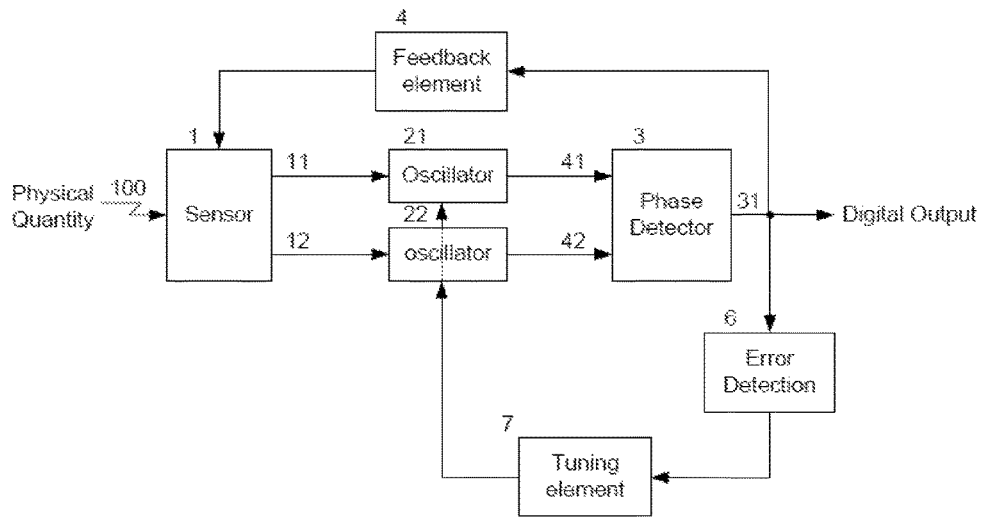
FIG. 2b shows a basic scheme of an embodiment of an oscillator based sensor interface according to the invention without chopping.
Figure 3:
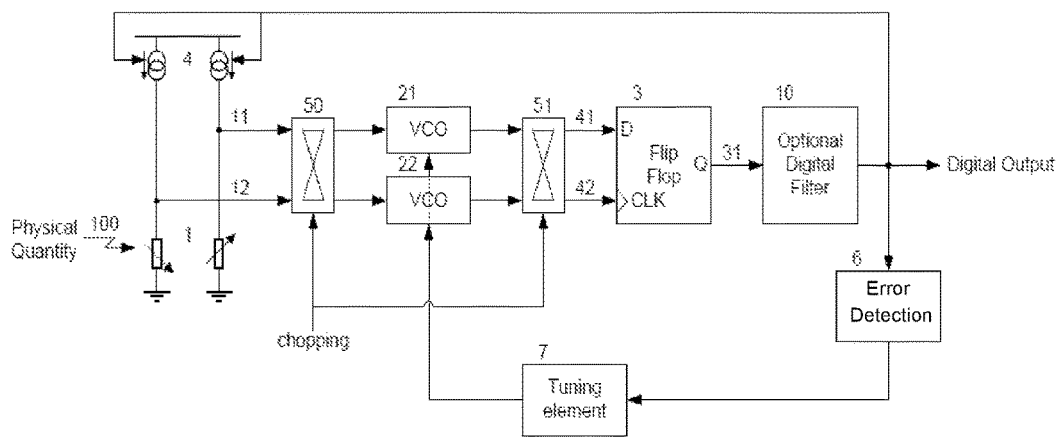
FIG. 3 shows an embodiment of an oscillator based sensor interface according to the invention.

Chopping is a well-known technique to reduce offset and low frequency noise in the voltage domain, but it can also be used in the time domain. In the following the basic operation of chopping is introduced using the embodiment of the circuit of the invention shown in FIG. 2a. This figure illustrates a basic scheme of an embodiment of the proposed oscillator based sensor interface circuit, wherein chopping is applied. Note that in the scheme of FIG. 2 the sensor is shown to be part of the interface circuit. Two chopping blocks (50,51) have been added before and after the oscillators (21, 22). The chopping operation can be divided into two phases. During one of the two chopping phases the switches of the chopper (50) connect input signal (11) to VCO (21) and input signal (12) to VCO (22). Simultaneously the second chopper switches (51) connect the output of VCO (21) to feed signal (41) to an input of the phase detector and the output of VCO (22) to apply (42) to the other phase detector input. In the other chopping phase the VCO (21) uses signal (12) as input and (42) as output while VCO (22) uses signal (11) as input and (41) as output. The phase of the chopping blocks is controlled by the CTRLcH signal. In the embodiment of FIG. 2a the oscillator outputs are dechopped (demodulated) in block 51, which outputs the signals 41, 42 to the phase detector. The phase detector (3) compares the output signals of the oscillators and accordingly outputs a digital phase detection output signal. In the embodiment of FIG. 3, the phase detector is implemented with a flip-flop and an optional digital filter (10) is introduced between the phase detector (3) and the output. The signals applied to the oscillators may be chopped (i.e. modulated with a signal with frequency $f_{chop}$) in block 50 and dechopped (demodulated) in block 51 in FIG. 2a. It is not mandatory that the inputs of block 50 all come from the sensor. Some of the inputs can also come from a reference signal or from another signal (e.g. a signal used for feedback or tuning). Although in advantageous embodiments of the sensor interface circuit according to the present invention chopping is applied, the use of chopping is not strictly needed, as will become apparent later in this description. Note that in FIG. 3 both resistors are influenced (in opposite direction) by the physical quantity, but the interface circuit also works in an embodiment where one of the resistors is fixed. This fixed resistor is used to generate a reference signal, e.g. using a current source on top of the figure. However, this can be done in a completely different way, e.g. by creating a reference voltage by a bandgap.

If both VCOs are identical, it makes no difference whether chopping is applied or not. The regulation loop causes equal averaged frequencies of both VCOs and this leads in the case of identical VCOs also to equal averaged voltages at the VCO inputs. If there is an offset mismatch between the VCOs, the regulation loop still forces equal averaged frequencies, but this now results in a small voltage difference between the inputs of the VCOs. This VCO input voltage difference is independent of the chopping phases. However, in one chopping phase the input of VCO 21 and 22 is connected through the chopping switches to node 11 and node 12, respectively, while in the other chopping phase node 12 is connected to VCO 21 and node 11 to VCO 22. This means the voltage difference between node 11 and node 12 is not the same in the two chopping phases: in one chopping phase it is positive and in the other phase negative. Such a change in voltage difference can only be caused (assuming that the physical quantity is stable) by the feedback loop, which means that the digital output is different in the different chopping phases. It is well known that offset can be removed by calculating the average of the digital output during both chopping phases together.

The working principle of oscillator based sensor interface circuits according to the invention is further explained with reference to FIG. 3. The sensor (1) consists in this embodiment of two resistors of which the resistance value for one increases and for the other decreases in the presence of the physical quantity (100). The resistors are biased by current sources, which function as the feedback element (4). The feedback element contains a fixed part and a variable part controlled by the digital output. The change in resistance due to the presence of the physical quantity (100) is converted through the current biasing in a voltage difference at the nodes (11) and (12). If the physical quantity increases, the voltage signal (11) at first instance increases while the voltage (12) at the other node decreases. Generally, the period of a VCO is approximately inversely proportional with the input voltage. Therefore the increase of the physical quantity makes VCO (21) faster and VCO (22) slower, which leads after one or more VCO periods to a situation wherein signal (41) has his rising edge before signal (42). At that moment the output (31) of the flip-flop used as phase detector (3) becomes high. This increases the output of the optional digital filter (10), which is updated every VCO period. This signal is fed back to the current sources used as feedback element (4). The feedback is done in such a way that the phases of signals (41) and (42) are locked to each other. This means the average frequency of both oscillators is the same. If both VCOs are perfectly matched, it also means that the average voltage of signals (11) and (12) is regulated to the same value. So the current at the left side is increased while the current at the right side is decreased to compensate for the resistance change caused by the increased physical quantity. The feedback loop ensures the ratio of the current difference and the common mode current is on average equal to the ratio of the resistance difference and the common mode resistance. Therefore the digital signal controlling the current sources represents the magnitude of the physical quantity.

Obtaining a good match between the oscillators is not always easy to achieve without having unwanted coupling (e.g. phase locking) between both. Mismatch of the oscillators can create errors which are sometimes difficult to compensate. Offset can easily be compensated by chopping. However, the oscillators can also have a different gain or different non-linearity. Such errors are more difficult to compensate. Chopping can facilitate the detection of mismatches between both VCOs, because mismatch leads to a difference in the (averaged) digital output in each chopping phase.

The oscillator-based sensor interface circuit thus comprises various building blocks which potentially affect the performance of the system wherein the circuit is applied. Hence, several sources of potential errors are present.

The average digital output during one chopping phase or during the other chopping phase is different when there is an offset mismatch between both VCOs as explained above. Other type of mismatches can cause a similar difference. This means that the subtraction of the average digital output of one chopping phase from the average digital output of the other chopping phase is a measure for the mismatch between both VCOs. The calculation of the output difference of both chopping phases is an example of an implementation of the error detection block 6, but other methods might be used. This output difference can be used as input of the tuning element to reduce the mismatch between both VCOs.

With the solution proposed in the present invention some of these errors can be reduced. According to the invention, the difference in the (averaged) digital output in each chopping phase can be detected in error detection block (6) and used to tune the oscillators by tuning element (7), see FIGS. 2 and 3, in such a way that this difference is compensated. This tuning can compensate for other error sources that cannot be compensated by the chopping only. It should be noted that this tuning can be done slowly, because the mismatch also varies slowly. FIG. 2*b* repeats the scheme of FIG. 2*a*, but without any chopping being applied.

In a circuit according to the present invention it is proposed to achieve a reduction of an error affecting the performance by tuning at least one parameter of the sensor interface circuit with a tuning element 7. The error is detected in error detection block 6. The tuning causes directly or indirectly in at least one of the oscillators a change in oscillator frequency. The error detection becomes easy if chopping is used, therefore the invention is described using the chopping.

The digital output signal contains also information of potential error sources. E.g. the difference of the digital output in both chopping phases provides an indication of the mismatch of the two oscillators (21, 22). This difference can be detected and calculated and quantized in the error detection block (6). This information can be used to tune with a tuning element (7) one or more parameters of at least one of the oscillators in order to reduce (or even completely remove) the errors caused by mismatch of the oscillators.

In a preferred embodiment the tuning is performed by regulating the gain of the oscillators, so that the oscillators output the same frequency at the operating point. It is to be noted that this does not mean that the tuning makes the gains of the VCOs equal. If there is also a mismatch in other parameters (e.g. offset), the gain is tuned to a different value for both VCOs to compensate for this other mismatch.

Figure 4:
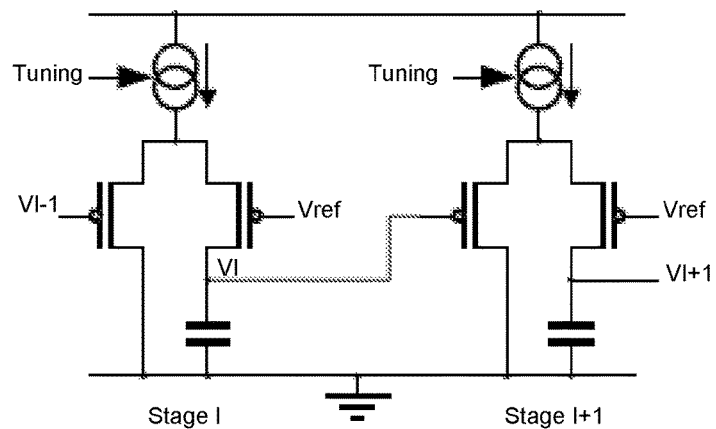
FIG. 4 illustrates two stages of a coupled saw tooth oscillator.

Gain tuning can be straightforward in many oscillator implementations. The VCO of FIG. 3 can for example be implemented with a coupled sawtooth oscillator. In FIG. 4 two stages of a coupled sawtooth oscillator are shown, but in practice several stages can be combined to make a multi-stage relaxation oscillator. The tuning can be performed by changing the current on top of the differential pair. Vref is the voltage input or is derived from the voltage input of the VCO. One can also use the current as input for a current controlled oscillator and perform the tuning by changing Vref.

Figure 5:
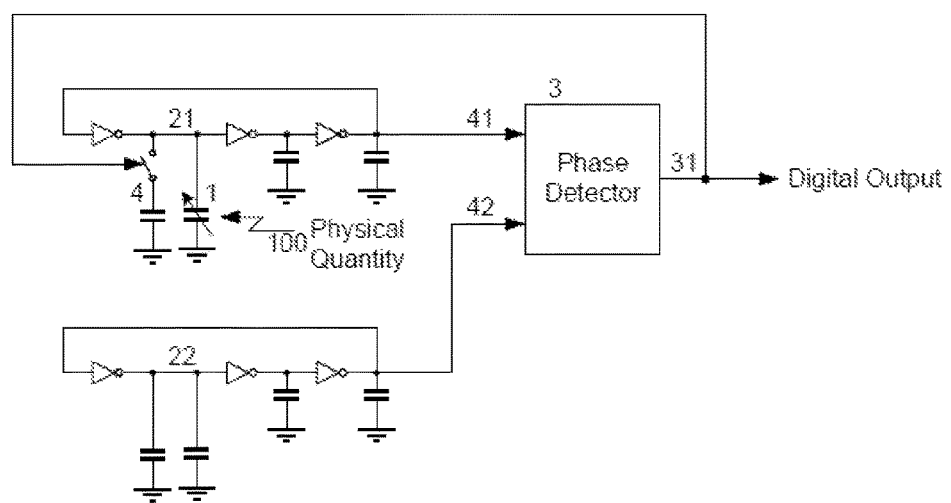
FIG. 5 illustrates an example of a closed-loop oscillator based capacitive sensor interface.
Figure 6:
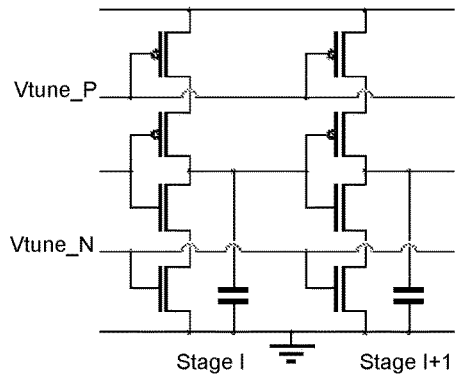
FIG. 6 illustrates two stages of a current starved ring oscillator.

The capacitive or sensor controlled oscillator of FIG. 5 can for example be implemented by a current starved ring oscillator of which two stages are shown in FIG. 6. Several stages can be combined to make a multi-stage relaxation oscillator. The gain is tuned by changing the current, which can be done by changing the bias voltages of the NMOS and PMOS transistors (Vtune_N and Vtune_P, respectively) between the inverters and the supply rails.

Alternatively, it may be the offset that is tuned to obtain the improved behaviour. In other embodiments the tuning is performed outside the oscillators. As an example an offset shift can be caused in the generation of the input voltage signal of the VCOs. Further one can tune for example the division factor of the oscillator outputs before the signal is applied to the phase detector. The skilled person will readily understand that the tuning can also be applied at other positions in the scheme without deviating from the scope of the invention.

In a preferred embodiment the tuning is done continuously and online, i.e. during the normal operation without disturbing the operation of the circuit. The digital outputs in the different chopping phases are indeed directly available during normal operation. So the use of chopping facilitates the usage of online tuning.

However, it is possible to obtain this error information without chopping e.g. in offline calibration. In that case embodiments of the circuit of the invention can be used without chopping. The circuit of the invention can also be used with offline or discontinuous tuning. E.g. there can be only a one time calibration or the calibration can be performed every time the system is powered-up or at regular moments. In these cases the tuning can be allowed to interrupt the normal application.

Instead of applying chopping one can force the same input signal to the oscillators and tune another parameter to get the same output frequency. Once the oscillators are tuned, there is also less advantage in performing chopping, because they match each other very well. Tuning can be used to minimize this difference and, hence, also the error.

More technical details on various embodiments of the invention are provided below.

The sensor converts a change of the physical quantity into a change of an electrical quantity, like e.g. resistance, capacitance, voltage, charge or current. Also other types of electrical signals can be applied. In case the sensor is part of the interface circuit, the electrical quantity contained in the sensor output can be directly used as input for the controlled oscillators or it can be chopped. In case the sensor is not part of the sensor interface circuit, the sensor output signal comprising the electrical quantity is applied to the interface circuit input, where it next can be used as input for the controlled oscillators or it can be chopped. In another embodiment the electrical quantity can be converted first into another electrical quantity, e.g. the resistance is converted into a voltage by forcing current through the resistor (as illustrated in the embodiment of FIG. 3). Furthermore the electrical quantity output by the sensor can also be amplified, filtered or processed in another way before it is used as input of the controlled oscillators. It can also be converted into another electrical quantity, e.g. voltage to current conversion through a transistor, optionally in velocity saturation mode where there is a linear behaviour between voltage and current.

The sensing means can be implemented in many different ways. One implementation of the sensor may be with two resistors, which are varied by the signal (e.g. pressure) that needs to be sensed (as in FIG. 3). Alternatively, only one resistor is variable and the other one is fixed. In another embodiment the number of resistors is different (e.g. four resistors in a Wheatstone bridge configuration). The skilled person will readily recognize that other configurations are also possible. Also other types of sensors can be used in various configurations. For example, instead of a resistive sensor, a capacitive sensor can be employed. In certain embodiments the sensor and the oscillator can be merged into a sensor controlled oscillator. An example is shown in FIG. 5 for a capacitive sensor, where the sensor 1 is formed by a single variable capacitor which is part of oscillator 21.

As already mentioned, in a preferred embodiment there are two controlled oscillators. However, there may be more than two oscillators. A third oscillator can for example be used to generate the master clock for the digital core of the chip comprising the sensor interface circuit. The two other oscillators could then be changed so that on average they are running at the same frequency as the third oscillator or at a certain fraction or multiple of it. Alternatively the digital master clock can be directly derived from one of the oscillators used by the sensor interface. In that case it can be advantageous to keep this oscillator at a fixed frequency and to control only the other oscillator. Also only one controlled oscillator can be used, for example in case there is only one sensing element (e.g. a capacitor) influenced by the physical quantity, like in FIG. 5. The fixed oscillator frequency used in some examples can also be generated by using a reference signal as input of a controlled oscillator.

Various kinds of controlled oscillators can be envisaged for use in the sensor interface circuit. An obvious choice is a voltage controlled oscillator (as e.g. in FIG. 3) or a current controlled oscillator, but other options are valid too, e.g. a capacitance controlled oscillator. As already mentioned, the sensor and the controlled oscillator can also be merged into a sensor controlled oscillator. FIG. 5 shows an example of a capacitive/sensor controlled oscillator: sensor capacitance 1 directly impacts the frequency of oscillator 21.

Figure 7:
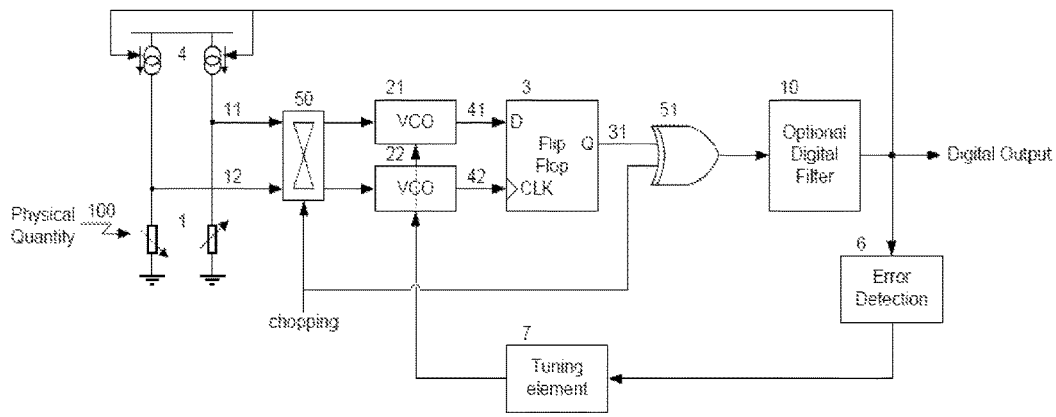
FIG. 7 shows an embodiment of an oscillator based sensor interface according to the invention.

In a preferred embodiment the demodulation is performed on the chopped signals coming out of the oscillators, as in block 51 shown in FIG. 2a or 3. In another embodiment one or more other functional blocks can be put in the scheme between the chopping (50) and dechopping (51) blocks. For example, the demodulation may be performed after the phase detection. In the case of a single bit phase detector the demodulation can be simply done with an EXOR-gate to invert the phase detector output or not, dependent on the chop signal value, as illustrated in FIG. 7. The demodulation can in principle also be done after the optional filter (10).

The chopping and dechopping can also be carried out in the oscillator itself, dependent on the oscillator topology. For example, the inputs and outputs of an internal comparator used to check the difference between a reference signal and a varying signal can be both swapped.

Mismatch of the oscillators leads to differences in the (averaged) digital output in the various chopping phases. This difference can be fed-back in the system to tune the difference towards zero.

In a preferred embodiment the chopping is applied to the oscillators. Other blocks (e.g. feedback element 4) can benefit from chopping or dynamic element matching as well. Also here tuning can be used, optionally in combination with chopping (or dynamic element matching), to reduce the system error even further.

The phase detector receives in certain embodiments the dechopped signals (see FIG. 3). However, as already mentioned, in other embodiments chopped signals are fed to the phase detector (see FIG. 7). The detector compares the phase of the signals received at its inputs.

The phase detector outputs a digital signal in accordance with the comparison result. The phase detector output signal is typically further filtered to get an accurate output of the sensor interface. Additionally the phase detector output (before or after filtering) is also fed back to close the loop in the system in order to form a PLL structure.

The phase detector output can be a single bit. In this simplest form the phase detector is just a D-flip-flop wherein one signal is used as clock and the other signal as data input, as illustrated in FIGS. 3 and 7. The output shows in this case only which of the two inputs toggled first. Also multi-bit phase detectors can be used. In that case the output contains further information about the time difference between the toggling of both inputs.

The phase detector output signal is used in the feedback loop. The feedback element (4) is capable of converting the digital phase detector output signal (after optional filtering) into a feedback signal. The feedback signal is used to keep the oscillator frequencies, which have a predefined link with each other, under control. In this way the interface circuit can be kept in balance. This implies the PLL should remain locked.

An example of a feedback element is shown in FIG. 3: current sources can be added to or removed from the current excitation of the resistive sensor. Both the physical quantity to be sensed and the current used as feedback signal are influencing the voltage input of the VCOs. Note that it is also possible that the feedback element is only changing one of the two currents, so e.g. the current sources on top of the fixed resistor could be independent of the digital output. This leads to a fixed reference voltage, which can also be made in another way (e.g. by a bandgap). Another example is shown in FIG. 5: one or more additional capacitors (4) can be added in parallel with the capacitive sensor (1) to match the total capacitance with a reference capacitor used in the other oscillator (22). In this case the feedback element (and the sensor) is part of the oscillator (21).

The feedback signal is often a representation of the physical signal to be sensed. In many embodiments the feedback signal is an electrical signal. This electrical signal can be used in the sensor excitation. The feedback signal can be a signal in the physical domain instead of in the electrical domain. For example, the phase detector output can be converted in a big voltage that generates an electrostatic force on a capacitive sensor, to force the capacitor plates closer together or further away. The sensor output signal then is a combination of the actual signal containing the physical quantity to be measured and the feedback signal. In another example, the feedback signal can modify the current excitation for a resistive sensor, resulting in a voltage signal used in the oscillators. In another embodiment one or more resistors of a Wheatstone bridge wherein one or more resistors is used as sensor element, is adjusted by the feedback signal.

The feedback signal goes back to the sensor element in the above-mentioned examples. This is not a hard requirement, although it is advantageous in many cases. In FIG. 5 the feedback signal changes the capacitance (4) in parallel with the sensor capacitance, while the capacitance in the other oscillator remains fixed. Alternatively one can apply the feedback signal to the other oscillator: the sensor capacitor is used in one oscillator and the other oscillator is matched by changing the capacitance by means of the feedback signal. The feedback signal can also go to two or more positions, e.g. to both sensors as shown in FIG. 3. Such a differential feedback is preferred in case both oscillator input signals are influenced by the sensor.

The tuning signal is used to compensate the errors of the interface circuit and/or the sensor system it is part of. Therefore it might be advantageous to have the tuning as close as possible to the main error source, which is often the oscillator.

The invention focusses on tuning of the oscillator mismatches. However, the tuning can also be applied to reduce the system errors caused by other blocks. The feedback element (4), for example, can also be a main source of system errors. So tuning (online or offline) can make sense here as well.

The tuning is actually also a feedback mechanism in case it is performed online, but there are some clear differences between the tuning and the feedback through the feedback element (4). To avoid confusion it is therefore not called feedback. The feedback is required to keep the circuit in balance, while the tuning takes care of reducing the errors. The feedback signal is a representation of the sensor signal, while the tuning signal is rather a representation of the mismatch present in some system elements (e.g. the oscillators). The feedback elements can best be connected as close as possible to the sensor, while the tuning can best be applied to the system elements that cause the mismatch (e.g. the oscillators). The feedback signal needs to change fast (typically every oscillator period), while the tuning is normally done much slower.

Figure 8:
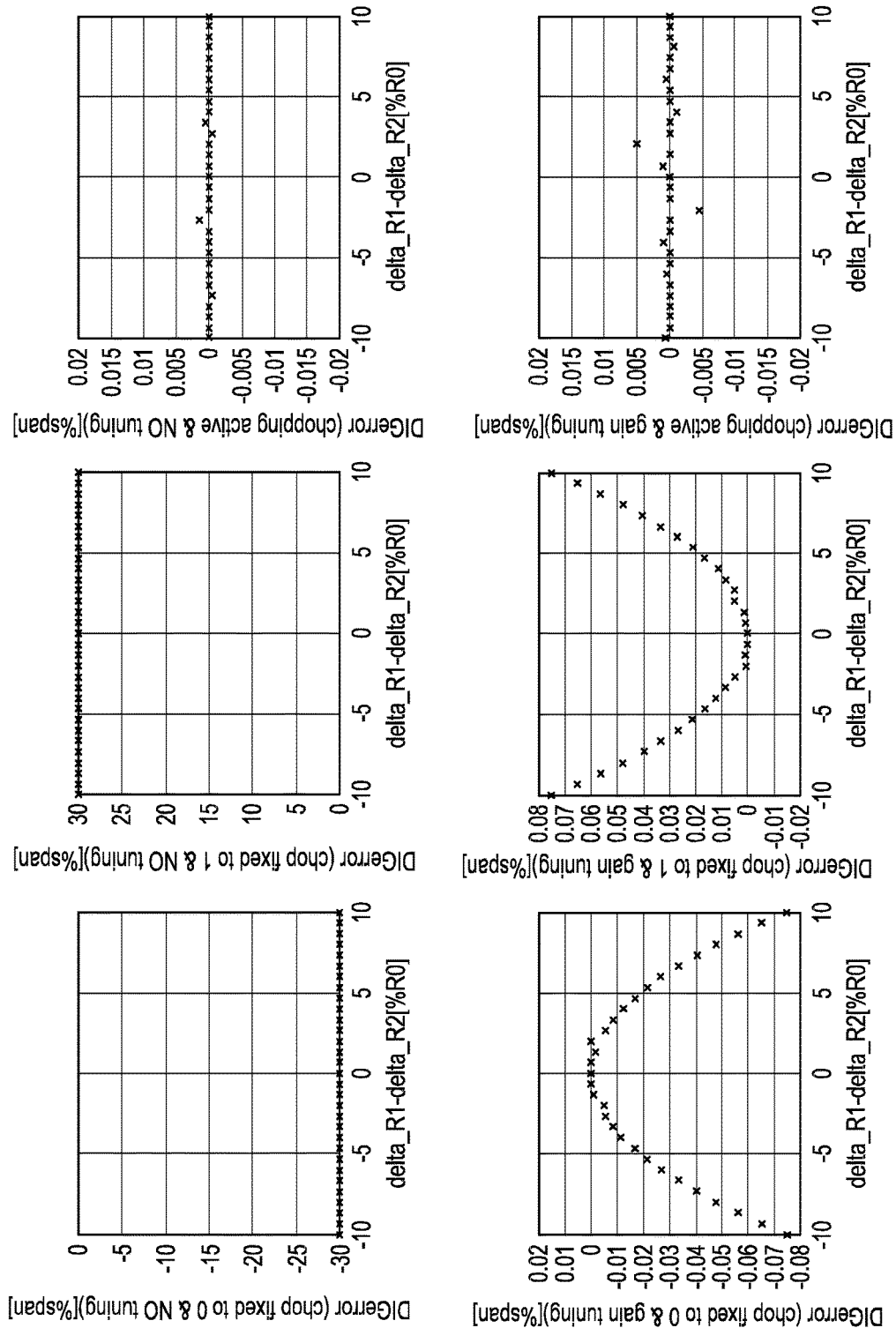
FIG. 8 illustrates simulation results in case of an offset mismatch of the oscillators.

Mismatch in the offset of the oscillators leads to offset in the sensor interface circuit. Chopping can be applied to cancel the system offset. No tuning is needed. Reversely also tuning can be used to reduce the system offset, without any chopping being required. This can be seen in the simulation plots of FIG. 8. FIG. 8 shows simulation plots when there is an offset mismatch between the oscillators for the resistive sensor interface circuit of FIG. 3. Chopping is only active on the plots at the right. Gain tuning is only applied on the plots at the bottom. An offset is applied that changes the frequency of both oscillators with 3% at the operating voltage, but in the opposite direction for both oscillators. This mismatch leads in this example to an output error of 30% of the output span when no chopping or gain tuning is applied (top left and top mid). Hence, without chopping or tuning a big error is made at the output when an offset mismatch of the oscillators is introduced. Chopping cancels the error (with or without gain tuning). Gain tuning without chopping (left bottom and mid bottom) can also reduce the offset error a lot. Remark however that the output error is dependent on several system parameters, so the resulting error can be different in other examples. The difference between the top left and top mid plot is the polarity of the chopping switches. The error is completely cancelled when both polarities are combined, i.e. with chopping (top right), besides some minor resolution limitations. Gain tuning completely cancels the output error in the middle of the range, even when there is no chopping applied (left bottom and mid bottom). There is however still a small error outside the middle of the range. This remaining error is removed when additional chopping is applied (right bottom).

Figure 9:
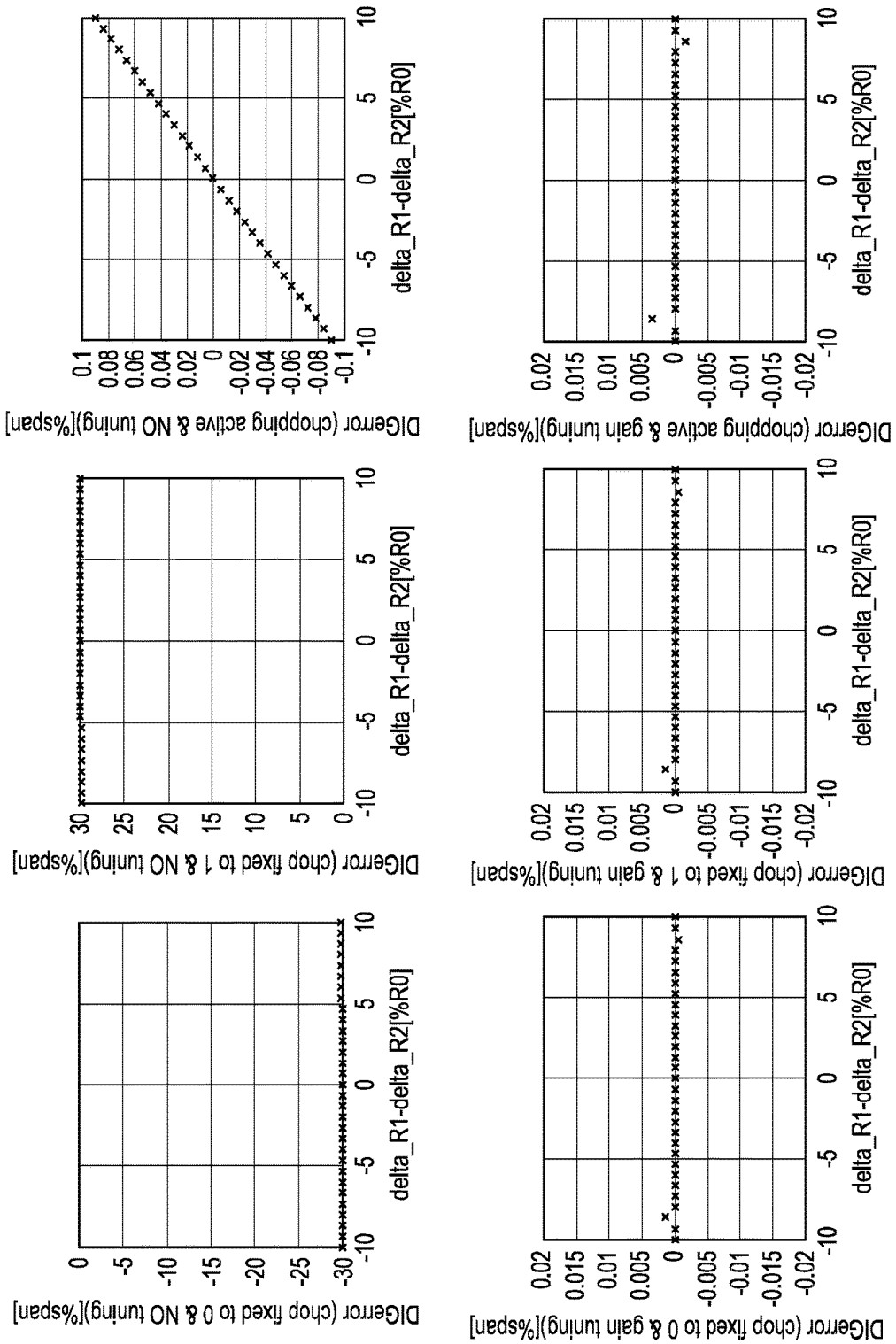
FIG. 9 illustrates simulation results in case of a gain mismatch of the oscillators.

Gain mismatch of the oscillators mainly leads to an offset error at the output. So chopping can reduce the error, but it cannot completely cancel it. Gain tuning can cancel gain mismatch errors of the oscillators, even without performing chopping. This can be seen in the plots of FIG. 9, showing simulation plots when there is a gain mismatch between the oscillators for the resistive sensor interface circuit of FIG. 3. Chopping is only active on the plots at the right. Gain tuning is only applied on the plots at the bottom. A gain error is applied that changes the frequency of both oscillators with 3% at the operating voltage, but in the opposite direction for both oscillators. This mismatch leads in this example to an output error of approximately 30% of the output span when no chopping or gain tuning is applied (top left and top mid). Remark however that the output error is dependent on several system parameters, so the resulting error can be different in other examples. The difference between the top left and top mid plot is the polarity of the chopping switches. The error is significantly reduced when both polarities are combined, i.e. with chopping (top right), but there is still a remaining gain error. Gain tuning completely cancels the output error, besides some resolution limitations. This is valid without chopping (left bottom and mid bottom) and with chopping (right bottom).

Figure 10:
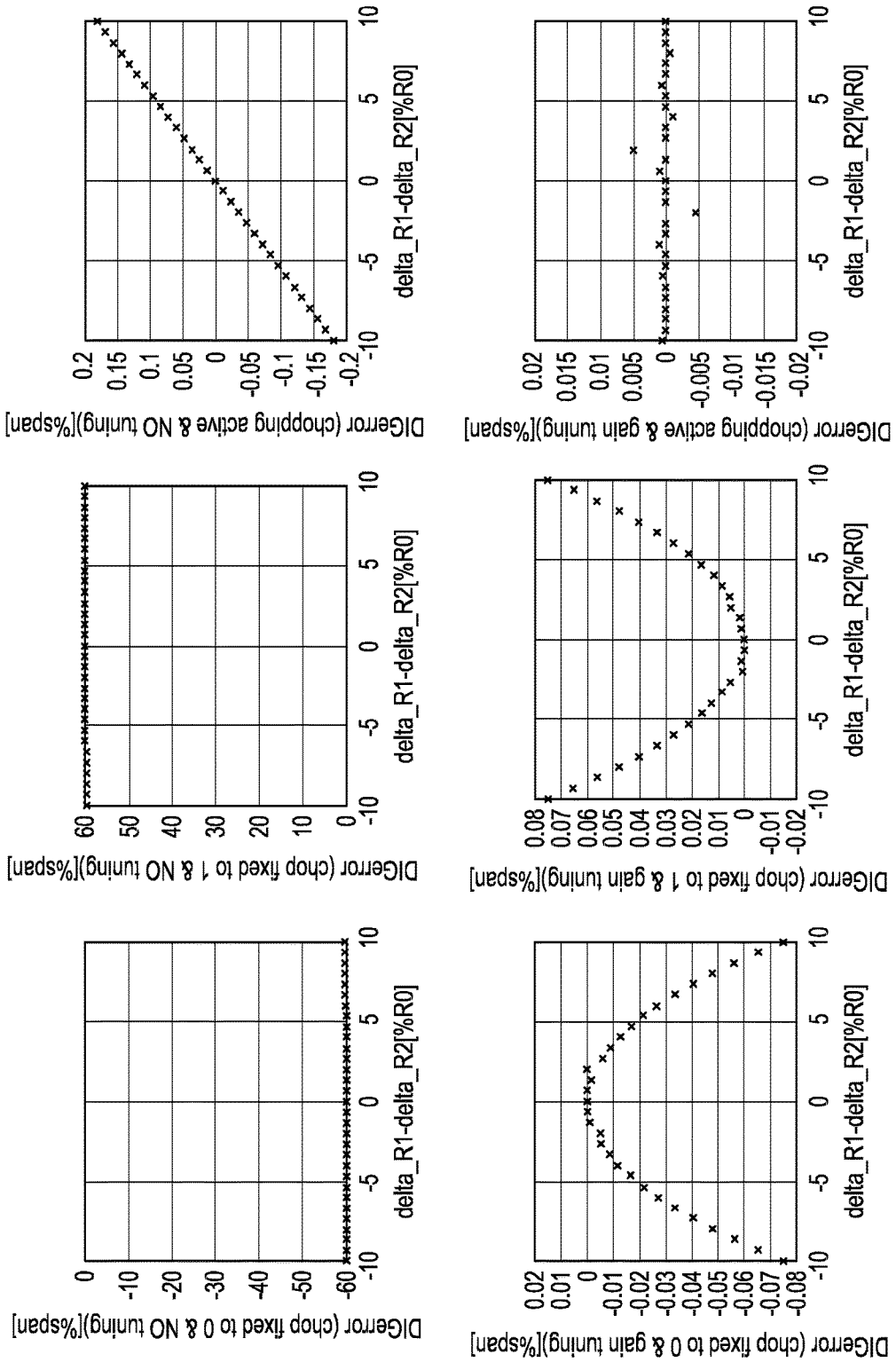
FIG. 10 illustrates simulation results in case of an offset and a gain mismatch of the oscillators.

The combination of offset and gain mismatch errors in the oscillators lead to bigger errors, which cannot be fully compensated by chopping. FIG. 10 shows simulation plots when there is an offset and gain mismatch between the oscillators for the resistive sensor interface circuit of FIG. 3. Chopping is only active for the plots at the right. Gain tuning is only applied for the plots at the bottom. The same offset error as in FIG. 8 and gain error as in FIG. 9 were applied. These errors lead in this example to an output error of approximately 60% of the output span when no chopping or gain tuning is applied (top left and top mid). The output error is dependent on several system parameters, so the resulting error could be different in other examples. The difference between the top left and top mid plot is the polarity of the chopping switches. The error is significantly reduced when both polarities are combined, i.e. with chopping (top right), but there is still a remaining gain error.

Chopping can fully compensate an offset error (FIG. 8) and can also reduce a gain mismatch of the VCOs (FIG. 9). Also the combination of offset error and gain mismatch is reduced by chopping, but the resulting error is bigger than the sum of the resulting errors of both error sources separately. Gain tuning can fully compensate a gain mismatch of the VCOs and can also reduce an offset error. Also the combination of offset error and gain mismatch is reduced by gain tuning and the resulting error is the same than with an offset error only. The error can however be completely compensated when gain tuning and chopping are combined. Tuning (in combination with chopping) is also more robust to other error sources (e.g. non-linearity) than chopping.

The above explanations on the building blocks make clear the numerous embodiments of the sensor interface circuit of this invention can be designed by appropriately combining components as described. The skilled person will readily understand this. By way of example the operation of the embodiments shown in FIGS. 3, 5 and 7 is now further described.

FIG. 3 shows an example of an oscillator based resistive sensor interface circuit. The architecture corresponds with FIG. 2a, but additional implementation details are provided. The sensor element (1) is made by two resistors, which change in opposite direction under influence of a physical quantity (100). Two current sources (4) are used to translate the resistance into a voltage (11, 12). These two voltages are used as inputs of the voltage controlled oscillators (21, 22). These two input voltages of the oscillators can be swapped, simultaneously with the two output signals of the oscillators, so that one gets modulation of the oscillator offset in order to remove it further on. The phase difference of the chopped oscillator outputs (41, 42) can be compared with a D-flip-flop (3) for example, because the Q-output contains the information of which oscillator is leading. Typically further filtering (10) is performed to obtain the digital output signal. The loop is closed by feeding back the digital signal to the current sources (4) on top of the sensor (1). These current sources are adjusted to keep the averaged phase difference of the oscillators close to 0. The digital output contains also information of potential error sources. E.g. the difference of the digital output in both chopping phases tells something about the mismatch of the two oscillators (21, 22). This difference can be measured and calculated (6) and fed-back to the oscillators through a tuning element (7).

FIG. 7 shows another example of an oscillator based resistive sensor interface circuit. It is the same as FIG. 3, except that the second chopper element (51) is now implemented with an EXOR-gate after the phase detector (3) and no longer with switches before the phase detector.

In the example of an oscillator based capacitive sensor interface circuit as in FIG. 5 the chopping and tuning is omitted not to overload the drawing. The sensor element is now formed by one capacitor (1), which is part of the oscillator itself (21). There is also an extra capacitor (4) that can be added or not in parallel with the sensor capacitance, dependent on the phase detector output (31). This capacitor (4) is the feedback element and the closed-loop ensures that theoretically one gets the same average capacitance in both oscillators (21, 22).

The proposed interface circuit contributes in making the sensor system more robust against other kind of non-idealities or combinations of errors. For illustration the following two examples are given:

The influence of a common mode voltage change of the two oscillator inputs is drastically reduced. This is not a problem for ideal VCOs, but common mode voltage variations have a clear impact at system level for practical VCOs. This influence is avoided by the proposed solution.

Asymmetrical behaviour of the sensor resistors is not compensated, but with gain tuning this error can be made fixed (and thus easy to compensate by calibration) even when the oscillators are not matched (and the mismatch drifts).

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. An oscillator-based sensor interface circuit arranged for offline error tuning comprising
    at least two oscillators, at least one of which is arranged for receiving an electrical signal representative of an electrical quantity, said electrical quantity being a converted physical quantity, and impacting said at least one oscillator's frequency,
    phase detection means arranged to compare output signals of said at least two oscillators and for outputting a digital phase detection output signal in accordance with the outcome of said comparing, said phase detector output signal also being an output signal of said oscillator-based sensor interface circuit,
    a feedback element arranged for receiving a representation of said digital phase detection output signal and for converting said representation into a feedback signal used directly or indirectly to maintain a given relation between oscillator frequencies of said at least two oscillators,
    means for detecting a difference between said at least two oscillators,
    at least one tuning element arranged for receiving said detected difference and for tuning at least one characteristic of the oscillator-based sensor interface circuit causing a change in oscillator frequency of at least one of said oscillators to reduce said detected difference.

2. An oscillator-based sensor interface circuit arranged for online error tuning, comprising
    at least two oscillators, at least one of which is arranged for receiving an electrical signal representative of an electrical quantity, said electrical quantity being a converted physical quantity and impacting said at least one oscillator's frequency,
    chopping circuitry arranged for modulating said electrical signal representative of said electrical quantity with a chopping signal and for feeding said modulated electrical signal to said at least one oscillator,
    phase detection means arranged to compare output signals of said at least two oscillators and for outputting a digital phase detection output signal in accordance with the outcome of said comparing, said phase detector output signal also being an output signal of said oscillator-based sensor interface circuit,
    whereby said chopping circuitry is further arranged for demodulating said output signals before applying said output signals to said phase detection means or for demodulating said digital phase detection output signal,
    said oscillator-based sensor interface circuit further comprising
    a feedback element arranged for receiving a representation of said digital phase detection output signal and for converting said representation into a feedback signal used directly or indirectly to maintain a given relation between oscillator frequencies of said at least two oscillators,
    detection means for detecting a difference between said at least two oscillators based on said digital phase detection output signal,
    at least one tuning element arranged for receiving said detected difference and for tuning at least one characteristic of the oscillator-based sensor interface circuit causing a change in oscillator frequency of at least one of said oscillators to reduce said detected difference.

3. The oscillator-based sensor interface circuit as in claim 2, further comprising a digital filter arranged for filtering said digital phase detection output signal and for applying said filtered digital phase detection output signal to said feedback element.

4. The oscillator-based sensor interface circuit as in claim 2, comprising a sensing means arranged for converting said physical quantity comprised in a received signal into said electrical quantity and for outputting said electrical signal representative of said electrical quantity.

5. The oscillator-based sensor interface circuit as in claim 4, wherein said sensing means comprises a sensor arranged for receiving said signal comprising said physical quantity and a reference element arranged to generate a reference signal.

6. The oscillator-based sensor interface circuit as in claim 4, comprising a Wheatstone bridge.

7. The oscillator-based sensor interface circuit as in claim 4, wherein said feedback signal goes back to said sensing means.

8. The oscillator-based sensor interface circuit as in claim 4, wherein said received signal is one of a pressure, a temperature, a force, a signal from an optical sensing means or from a magnetic sensing means.

9. The oscillator-based sensor interface circuit as in claim 2, wherein said feedback element comprises at least one current source.

10. The oscillator-based sensor interface circuit as in claim 2, wherein said phase detection means comprises a flip-flop.

11. The oscillator-based sensor interface circuit as in claim 2, wherein said means is arranged for detecting said error by making a difference of the digital output signals obtained after said chopping.

12. The oscillator-based sensor interface circuit as in claim 2, wherein said at least one tuning element arranged for gain tuning at least one of said at least two oscillators.

13. The oscillator-based sensor interface circuit as in claim 2, wherein said at least one tuning element arranged for offset tuning at least one of said at least two oscillators.

* * * * *